United States Patent
Chaware et al.

(10) Patent No.: US 11,163,019 B1
(45) Date of Patent: Nov. 2, 2021

(54) MAGNETIC FIELD SENSORS HAVING STRAY FIELD REJECTION

(71) Applicant: Allegro MicroSystems, LLC, Manchester, NH (US)

(72) Inventors: Virag V. Chaware, Nashua, NH (US); Aaron Cook, Deerfield, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 16/985,577

(22) Filed: Aug. 5, 2020

(51) Int. Cl.
*G01R 33/00* (2006.01)
*G01R 33/07* (2006.01)

(52) U.S. Cl.
CPC ......... *G01R 33/0017* (2013.01); *G01R 33/07* (2013.01)

(58) Field of Classification Search
CPC ............ G01R 33/0017; G01R 33/0029; G01R 15/185
See application file for complete search history.

(56) References Cited

U.S. PATENT DOCUMENTS

| | | |
|---|---|---|
| 7,425,821 B2 | 9/2008 | Monreal et al. |
| 7,605,647 B1 | 10/2009 | Romero et al. |
| 8,542,010 B2 | 9/2013 | Cesaretti et al. |
| 8,680,846 B2 | 3/2014 | Cesaretti et al. |
| 8,692,546 B2 | 4/2014 | Cesaretti et al. |
| 2003/0151406 A1* | 8/2003 | Wan ..................... G01R 15/205 324/252 |
| 2005/0156587 A1* | 7/2005 | Yakymyshyn ....... G01R 15/207 324/117 R |
| 2008/0094055 A1* | 4/2008 | Monreal ................ G01R 33/02 324/117 H |
| 2013/0154631 A1* | 6/2013 | Tamura .............. G01R 19/0038 324/226 |
| 2013/0214774 A1 | 8/2013 | Cesaretti et al. |

(Continued)

FOREIGN PATENT DOCUMENTS

JP 2008286695 A 11/2008

OTHER PUBLICATIONS

U.S. Notice of Allowance dated Sep. 30, 2020 for U.S. Appl. No. 15/936,888; 9 Pages.

(Continued)

*Primary Examiner* — Alvaro E Fortich
(74) *Attorney, Agent, or Firm* — Daly, Crowley, Mofford & Durkee, LLP

(57) ABSTRACT

Described embodiments provide a magnetic field sensor that includes first and second spaced magnetic field sensing elements that each generate a signal indicative of a magnetic field associated with a target. A switching module couples a first terminal of the first magnetic field sensing element having a first polarity to a first terminal of the second magnetic field sensing element having a polarity opposite the first polarity to generate a first combined signal. The switching module couples a second terminal of the first magnetic field sensing element having a polarity opposite the first polarity to a second terminal of the second magnetic field sensing element having the first polarity to generate a second combined signal. The switching module simultaneously couples the first and the second combined signals to an amplifier, which generates an output signal indicative of the magnetic field that has stray magnetic field effects cancelled.

19 Claims, 6 Drawing Sheets

(56) References Cited

U.S. PATENT DOCUMENTS

| | | |
|---|---|---|
| 2014/0177674 A1 | 6/2014 | Drouin et al. |
| 2015/0070002 A1 | 3/2015 | Schott |
| 2016/0282425 A1* | 9/2016 | Haas .................. G01R 15/202 |
| 2019/0302196 A1 | 10/2019 | Cook |

OTHER PUBLICATIONS

Rule 312 Amendment dated Oct. 19, 2020 for U.S. Appl. No. 15/936,888; 12 Pages.
Extended European Search Report dated Sep. 3, 2019 for European Application No. 19161225.8; 6 Pages.
Communication pursuant to Rule 69 EPC dated Oct. 8, 2019 for European Application No. 19161225.8; 2 pages.
Response (with Amended Claims) to European Official Communication dated Oct. 8, 2019 and to European Extended Search dated Sep. 3, 2019 for European Application No. 19161225.8; Response filed Apr. 2, 2020; 50 Pages.
Restriction Requirement dated Mar. 6, 2020 for U.S. Appl. No. 15/936,888; 7 pages.
Response to Restriction Requirement dated Mar. 25, 2020 for U.S. Appl. No. 15/936,888; 1 page.
Office Action dated Jul. 23, 2020 for U.S. Appl. No. 15/936,888; 13 pages.
Response to Office Action dated Aug. 12, 2020 for U.S. Appl. No. 15/936,888; 13 pages.

* cited by examiner $V_{OUT} => (off_L - off_R) + (sig_L - sig_R)$ $V_{OUT} => (off_L - off_R) + (sig_L - sig_R)$ $V_{OUT} => (off_L - off_R) - (sig_L - sig_R)$ $V_{OUT} => (off_L - off_R) - (sig_L - sig_R)$

MAGNETIC FIELD SENSORS HAVING STRAY FIELD REJECTION

CROSS REFERENCE TO RELATED APPLICATIONS

Not Applicable.

STATEMENT REGARDING FEDERALLY SPONSORED RESEARCH

Not Applicable.

FIELD

The present disclosure relates generally to magnetic field sensors and more specifically to such sensors having stray field rejection.

BACKGROUND

Magnetic field sensors may employ one or more magnetic field sensing elements and are used in a variety of applications, including, but not limited to, a current sensor that senses a magnetic field generated by a current carried by a current-carrying conductor, a magnetic switch or proximity detector that senses proximity of a ferromagnetic or magnetic target object, a rotation detector that senses passing ferromagnetic articles, for example, gear teeth, and a magnetic field sensor that senses a magnetic field density of a magnetic field.

Various magnetic field sensors may employ a variety of types of magnetic field sensing elements, including, but not limited to, Hall effect elements, magnetoresistance elements, and magnetotransistors. Hall effect elements generate an output voltage proportional to a magnetic field. It is known that Hall effect elements can exhibit an undesirable DC (Direct Current) offset voltage. Further, some magnetic field sensors employ differential magnetic field sensing whereby spatially separated magnetic field sensing elements are used to generate a differential signal to reduce stray magnetic field effects.

SUMMARY

Described embodiments provide a magnetic field sensor having a first magnetic field sensing element and a second magnetic field sensing element disposed at a predetermined distance from the first magnetic field sensing element. The first and second magnetic field sensing elements generate first and second magnetic field signals, respectively, that are indicative of a magnetic field associated with a target. A switching module couples the first magnetic field sensing element and the second magnetic field sensing element in parallel to an amplifier by coupling a first terminal of the first magnetic field sensing element having a first polarity to a first terminal of the second magnetic field sensing element having a polarity opposite the first polarity to generate a first combined signal, and coupling a second terminal of the first magnetic field sensing element having a polarity opposite the first polarity to a second terminal of the second magnetic field sensing element having the first polarity to generate a second combined signal. The switching module simultaneously couples the first combined signal and the second combined signal to the amplifier. The amplifier generates a magnetic field output signal indicative of a difference between the first combined signal and the second combined signal. The difference is indicative of the magnetic field associated with the target that has stray magnetic field effects cancelled.

Aspects provide that the switching module is one or more of: a switch matrix comprising a plurality of switches, and one or more multiplexers. The switching module can provide chopping to reduce a DC offset of the first magnetic field signal and the second magnetic field signal.

Aspects provide that each of the first and second magnetic field sensing elements has four terminals, and the switching module includes a set of four switches for each terminal of the first and second magnetic field sensing elements, each set of four switches selectively coupling each terminal to one of a drive input signal having a positive polarity, a drive input signal having a negative polarity, an output signal having a positive polarity, and an output signal having a negative polarity. For the first magnetic field sensing element, a first terminal is coupled to the positive polarity drive input signal, a second terminal opposite the first terminal is coupled to the negative polarity drive input signal, a third terminal is coupled to the positive polarity output signal, and a fourth terminal is coupled to the negative polarity output signal. For the second magnetic field sensing element, a first terminal is coupled to the positive polarity drive input signal, a second terminal opposite the first terminal is coupled to the negative polarity drive input signal, a third terminal is coupled to the positive polarity output signal, and a fourth terminal is coupled to the negative polarity output signal.

Aspects provide that, to perform chopping, the switching module selectively changes which of the four terminals of the first magnetic field sensing element is coupled to the positive polarity drive input signal, the negative polarity drive input signal, the positive polarity output signal, and the negative polarity output signal, and to selectively change which of the four terminals of the second magnetic field sensing element is coupled to the positive polarity drive input signal, the negative polarity drive input signal, the positive polarity output signal, and the negative polarity output signal, wherein the selective changing reduces a DC offset of the first and second combined signals. A clock module generates a clock signal, and the switching module provides chopping based upon the clock signal.

Aspects provide that the switching module selectively provides chopping for one of: zero phases, two phases, and four phases. The switching module provides chopping for zero phases by not selectively changing which terminals of the first and second magnetic field sensing elements are coupled to the positive polarity drive input signal, the negative polarity drive input signal, the positive polarity output signal, and the negative polarity output signal. The switching module provides chopping for 2 phases (2× chopping) by selectively changing between a first set of terminal connections and a second set of terminal connections to the positive polarity drive input signal, the negative polarity drive input signal, the positive polarity output signal, and the negative polarity output signal. The switching module provides chopping for 4 phases (4× chopping) by selectively changing between a first set of terminal connections, a second set of terminal connections, a third set of terminal connections, and a fourth set of terminal connections to the positive polarity drive input signal, the negative polarity drive input signal, the positive polarity output signal, and the negative polarity output signal.

Aspects provide that the switching module provides a determined drive signal to a selected terminal of each of the first and the second magnetic field sensing elements. The drive signal is one of a determined voltage and a determined current. Aspects provide that a controller coupled to the switching module generates a sensor output signal indicative of the magnetic field output signal. Aspects provide that the first and second magnetic field sensing elements are one or more Hall effect elements. Aspects provide that the magnetic field output signal is proportional to a difference between the first magnetic field signal and the second magnetic field signal.

Another embodiment provides a method for sensing a magnetic field. A first magnetic field signal is generated with a first magnetic field sensing element, the first magnetic field signal indicative of a magnetic field associated with a target. A second magnetic field signal is generated with a second magnetic field sensing element spaced from the first magnetic field sensing element, the second magnetic field signal indicative of the magnetic field associated with the target. A magnetic field output signal indicative of the magnetic field is generated by coupling the first magnetic field sensing element and the second magnetic field sensing element in parallel to an amplifier by coupling a first terminal of the first magnetic field sensing element having a first polarity to a first terminal of the second magnetic field sensing element having a polarity opposite the first polarity and generating a first combined signal, and coupling a second terminal of the first magnetic field sensing element having a polarity opposite the first polarity to a second terminal of the second magnetic field sensing element having the first polarity and generating a second combined signal. The first combined signal and the second combined signal are simultaneously coupled to the amplifier. The magnetic field output signal is generated that is indicative of a difference between the first combined signal and the second combined signal that has stray magnetic field effects cancelled.

Aspects provide chopping to reduce a DC offset of the first magnetic field signal and the second magnetic field signal. Aspects provide that each of the first and second magnetic field sensing elements has four terminals. A set of switches coupled to each terminal of the first magnetic field sensing element selectively couples a first terminal of the first magnetic field sensing element to a positive polarity drive input signal, a second terminal of the first magnetic field sensing element, opposite the first terminal, to a negative polarity drive input signal, a third terminal of the first magnetic field sensing element to a positive polarity output signal, and a fourth terminal of the first magnetic field sensing element, opposite the third terminal, to a negative polarity output signal. A set of switches coupled to each terminal of the second magnetic field sensing element selectively couples a first terminal of the second magnetic field sensing element to a positive polarity drive input signal, a second terminal of the second magnetic field sensing element, opposite the first terminal, to a negative polarity drive input signal, a third terminal of the second magnetic field sensing element to a positive polarity output signal, and a fourth terminal of the second magnetic field sensing element, opposite the third terminal, to a negative polarity output signal. Aspects selectively change which of the four terminals of the first magnetic field sensing element is coupled to the positive polarity drive input signal, the negative polarity drive input signal, the positive polarity output signal, and the negative polarity output signal, and to selectively change which of the four terminals of the second magnetic field sensing element is coupled to the positive polarity drive input signal, the negative polarity drive input signal, the positive polarity output signal, and the negative polarity output signal, wherein the selective changing reduces a DC offset of the first and second combined signals.

Aspects provide that the chopping includes performing chopping for zero phases by not selectively changing which terminals of the first and second magnetic field sensing elements are coupled to the positive polarity drive input signal, the negative polarity drive input signal, the positive polarity output signal, and the negative polarity output signal. Aspects provide that the chopping includes performing chopping for 2 phases (2× chopping) by selectively changing between a first set of terminal connections and a second set of terminal connections to the positive polarity drive input signal, the negative polarity drive input signal, the positive polarity output signal, and the negative polarity output signal. Aspects provide that the chopping includes performing chopping for 4 phases (4× chopping) by selectively changing between a first set of terminal connections, a second set of terminal connections, a third set of terminal connections, and a fourth set of terminal connections to the positive polarity drive input signal, the negative polarity drive input signal, the positive polarity output signal, and the negative polarity output signal.

Aspects provide a determined drive signal to a selected terminal of each of the first and the second magnetic field sensing elements. The drive signal is one of a determined voltage and a determined current. Aspects generate a sensor output signal indicative of the magnetic field output signal. Aspects provide that the first and second magnetic field sensing elements each comprise one or more Hall effect elements.

Another embodiment provides a magnetic field sensor having a first magnetic field sensing element to generate a first magnetic field signal indicative of a magnetic field associated with a target, and a second magnetic field sensing element, disposed at a predetermined distance from the first magnetic field sensing element, to generate a second magnetic field signal indicative of the magnetic field associated with the target. The first magnetic field sensing element and the second magnetic field sensing element are coupled in parallel to an amplifier. A first terminal of the first magnetic field sensing element having a first polarity is coupled to a first terminal of the second magnetic field sensing element having a polarity opposite the first polarity to generate a first combined signal. A second terminal of the first magnetic field sensing element having a polarity opposite the first polarity is coupled to a second terminal of the second magnetic field sensing element having the first polarity to generate a second combined signal. The first combined signal and the second combined signal are provided to the amplifier, which generates a magnetic field output signal indicative of a difference between the first combined signal and the second combined signal. The difference is indicative of the magnetic field associated with the target that has stray magnetic field effects cancelled.

Another embodiment provides a magnetic field sensor having first magnetic field sensing means to generate a first magnetic field signal indicative of a magnetic field associated with a target, and second magnetic field sensing means, disposed at a predetermined distance from the first magnetic field sensing means, to generate a second magnetic field signal indicative of the magnetic field associated with the target. Switching means couple the first magnetic field sensing means and the second magnetic field sensing means in parallel to amplification means. The switching means couples a first terminal of the first magnetic field sensing means having a first polarity to a first terminal of the second magnetic field sensing means having a polarity opposite the first polarity to generate a first combined signal. The switching means couples a second terminal of the first magnetic field sensing means having a polarity opposite the first polarity to a second terminal of the second magnetic field sensing means having the first polarity to generate a second combined signal. The switching means simultaneously couples the first combined signal and the second combined signal to the amplification means. The amplification means generates a magnetic field output signal indicative of a difference between the first combined signal and the second combined signal. The difference is indicative of the magnetic field associated with the target that has stray magnetic field effects cancelled.

Another embodiment provides a magnetic field sensor having first magnetic field sensing means to generate a first magnetic field signal indicative of a magnetic field associated with a target and second magnetic field sensing means, disposed at a predetermined distance from the first magnetic field sensing means, to generate a second magnetic field signal indicative of the magnetic field associated with the target. The first magnetic field sensing means and the second magnetic field sensing means are coupled in parallel to amplification means. A first terminal of the first magnetic field sensing means having a first polarity is coupled to a first terminal of the second magnetic field sensing means having a polarity opposite the first polarity to generate a first combined signal. A second terminal of the first magnetic field sensing means having a polarity opposite the first polarity is coupled to a second terminal of the second magnetic field sensing means having the first polarity to generate a second combined signal. The first combined signal and the second combined signal are provided to the amplification means. The amplification means generates a magnetic field output signal indicative of a difference between the first combined signal and the second combined signal. The difference is indicative of the magnetic field associated with the target that has stray magnetic field effects cancelled.

BRIEF DESCRIPTION OF THE DRAWINGS

Other aspects, features, and advantages will become more fully apparent from the following detailed description, the appended claims, and the accompanying drawings in which like reference numerals identify similar or identical elements. Reference numerals that are introduced in the specification in association with a drawing figure may be repeated in one or more subsequent figures without additional description in the specification in order to provide context for other features.

DETAILED DESCRIPTION

Figure 1:
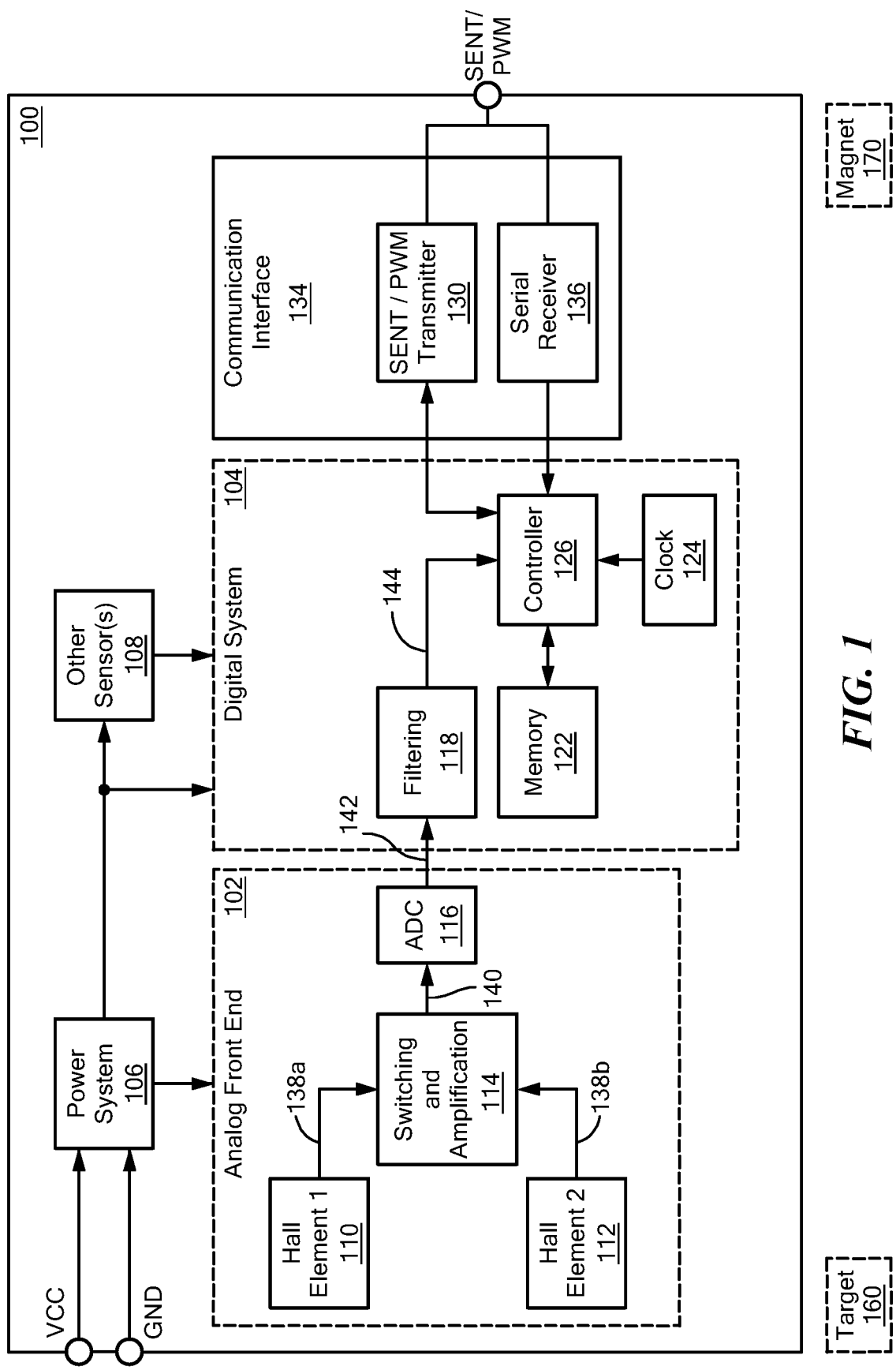
FIG. 1 shows a block diagram of a magnetic field sensor in accordance with described embodiments.

In accordance with described embodiments, a magnetic field sensor is provided having a first magnetic field sensing element and a second magnetic field sensing element disposed at a predetermined distance from the first magnetic field sensing element. The first and second magnetic field sensing elements generate first and second magnetic field signals, respectively, that are indicative of a magnetic field associated with a target. A switching module couples the first magnetic field sensing element and the second magnetic field sensing element in parallel to an amplifier by coupling a first terminal of the first magnetic field sensing element having a first polarity to a first terminal of the second magnetic field sensing element having a polarity opposite the first polarity to generate a first combined signal, and coupling a second terminal of the first magnetic field sensing element having a polarity opposite the first polarity to a second terminal of the second magnetic field sensing element having the first polarity to generate a second combined signal. The switching module simultaneously couples the first combined signal and the second combined signal to the amplifier. The amplifier generates a magnetic field output signal indicative of the magnetic field associated with the target that has stray magnetic field effects cancelled.

By way of introduction, as used herein, the term "magnetic field sensing element" describes a variety of types of electronic elements that sense a magnetic field. The magnetic field sensing elements can be, but are not limited to, Hall effect elements, magnetoresistance elements, or magnetotransistors. There are different types of Hall effect elements, for example, planar Hall elements, vertical Hall elements, and circular Hall elements. There are different types of magnetoresistance elements, for example, anisotropic magnetoresistance (AMR) elements, giant magnetoresistance (GMR) elements, tunneling magnetoresistance (TMR) elements, Indium antimonide (InSb) elements, and magnetic tunnel junction (MTJ) elements. Most, but not all, types of magnetoresistance elements tend to have axes of maximum sensitivity parallel to a substrate that supports the magnetic field sensing element and most, but not all, types of Hall elements tend to have axes of sensitivity perpendicular to a substrate that supports the magnetic field sensing element.

As used herein, the term "magnetic field sensor" describes a circuit that includes one or more magnetic field sensing elements. Magnetic field sensors are used in a variety of applications, including, but not limited to, a current sensor that senses a magnetic field generated by a current carried by a current-carrying conductor, a magnetic switch or proximity detector that senses the proximity of a ferromagnetic or magnetic object, a rotation detector that senses passing ferromagnetic articles, for example, gear teeth, and a magnetic field sensor that senses a magnetic field density of a magnetic field. In general, the circuits and techniques described herein apply to any magnetic field sensor capable of detecting a magnetic field.

FIG. 1 shows a block diagram of a magnetic field sensor, shown as magnetic field sensor 100. In described embodiments, magnetic field sensor 100 may be a magnetic angle and linear position sensing integrated circuit for consumer, industrial, and automotive applications. Magnetic field sensor 100 may employ various types of magnetic field sensing elements 110, 112 to sense a magnetic field associated with a target 160. In some embodiments, target 160 may be a magnetic element. In other embodiments, target 160 may be a ferromagnetic element that affects a magnetic field when positioned in proximity to a magnet 170 (e.g., a back-biased configuration). In some embodiments, magnetic field sensor 100 may be provided as an integrated circuit.

As shown in FIG. 1, magnetic field sensor 100 may include analog front end (AFE) 102 and digital system 104. Power system 106 may receive one or more input voltages (shown as voltage signal VCC in FIG. 1) and a ground or common signal (shown as GND signal in FIG. 1). Power system 106 may provide power signals (e.g., one or more voltages) to AFE 102 and digital system 104, as well as to one or more other sensors 108. In some embodiments, other sensors 108 may include one or more additional sensors to sense conditions of magnetic field sensor 100 and/or the environment in which magnetic field sensor 100 is deployed, for example one or more temperature sensors for use to compensate sensitivity and/or offset of magnetic field sensor 100 over temperature.

In some embodiments, AFE 102 may include a plurality of magnetic field sensing elements, shown as Hall effect elements 110 and 112. It will be appreciated that in various embodiments, other types of magnetic field sensing elements may be used and also that other numbers of magnetic field sensing elements may be used.

Figure 4:
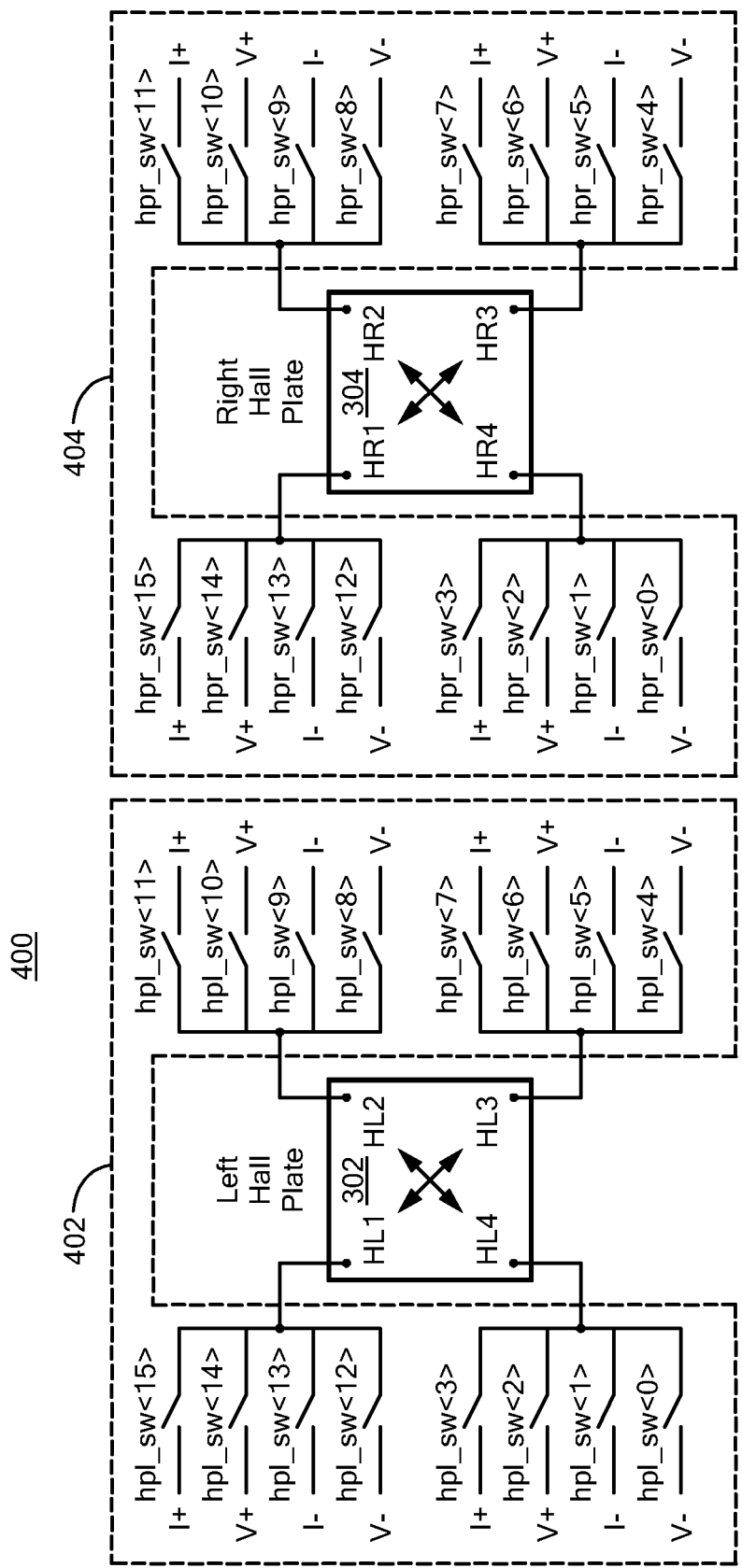
FIG. 4 shows an illustrative schematic of a chopping circuit in accordance with described embodiments.

Hall effect elements 110 and 112 may be coupled to switching and amplification circuit 114, which is described in greater detail in regard to FIG. 4. As shown, Hall effect elements 110 and 112 may provide respective magnetic field signals 138a and 138b to switching and amplification circuit 114. In some embodiments, one or more amplifiers may amplify the signals output from Hall effect elements 110 and 112.

Switching and amplification circuit 114 may provide combined analog output signal 140 to analog-to-digital converter (ADC) 116, which converts combined analog output signal 140 into digital output signal 142, which in turn is provided to digital system 104. As will be described, digital system 104 may process the received digital signal 142 and, in response, generate one or more output signals from magnetic field sensor 100. For example, in some embodiments, magnetic field sensor 100 may be in communication with an engine control unit (ECU) of a vehicle, or other control unit in a system in which magnetic field sensor 100 is deployed, via one or more signals received by or transmitted from magnetic field sensor 100 (e.g., SENT/PWM signal shown in FIG. 1).

In some embodiments, elements 110 and 112 may be disposed proximate to one another at a predetermined distance (e.g., on the order of millimeters apart). In one embodiment, the elements may be on the order of 2-3 mm apart in order to sense a difference in magnetic field gradients between the elements and may generally be referred to herein in directional terms, such as "left" and "right" elements. According to the disclosure, output signals 138a, 138b from respective spatially separated magnetic field sensing elements 110, 112 can be combined (e.g., subtracted) by switching and amplification circuit 114 such that any effects from stray magnetic fields experienced by both sensing elements (i.e., common to both elements) tend to cancel in the resulting differential magnetic field signal 140, whereas the field that is desired to be detected can be readily detectable from the resulting differential magnetic field signal.

In some embodiments, each magnetic field sensing element 110, 112 has multiple terminals, or contacts. For example, in embodiments, elements 110, 112 are Hall effect elements or plates, each having four terminals, two of which are coupled to a bias or drive source (i.e., current or voltage source) and two of which provide a differential element output signal. It will be appreciated that, in embodiments, described elements 110, 112 may each include more than one such element configured to permit magnetic field sensing in three dimensions, as may be achieved using planar and vertical Hall elements. Thus, elements 110, 112 can each include one or more than one magnetic field sensing element of various types, which types can be the same or different.

As will be described in greater detail in regard to FIGS. 3, 4 and 5, switching and amplification circuit 114 is configured to selectively couple elements 110 and 112 and generate combined analog output signal 140. In such embodiments, switching and amplification circuit 114 couples drive signals to selected terminals of each element 110 and 112, and couples other selected terminals of elements 110 and 112 to each other and to an amplifier. As will be described, switching and amplification circuit 114 may be configured to couple analog output signals from each element such that the output signal from one of the elements has an inverted polarity with respect to the output signal from the other element. The two analog output signals may be directly combined to form a combined analog output signal 140 that has cancelled the effects from stray magnetic signals (e.g., common mode effects). As will be described, this may allow use of only a single amplifier to generate the combined analog output signal, rather than processing the output of each element separately. Additionally, by directly combining the output signals of the elements in the analog domain, more complex circuitry and/or processing algorithms can be avoided.

Additionally, as will be described in greater detail in regard to FIGS. 4 and 5, in some embodiments, to reduce DC offset of the Hall effect elements, "chopping" or "current spinning" may be employed. Chopping refers to driving a Hall effect element in two or more different directions by changing which sensing element terminals are coupled to power and ground connections and receiving output signals at different terminals as the Hall effect element is differently driven. In such embodiments, switching and amplification circuit 114 may also receive clock signal(s) from clock module 124 and/or control signal(s) from controller 126. In this way, selected drive and output signal contact pairs are interchanged during each phase of the chopping and offset voltages tend to cancel. Thus, in described embodiments, switching and amplification circuit 114 may achieve both DC offset reduction and stray effect cancellation for magnetic field sensor 100.

As shown in FIG. 1, digital system 104 may include filtering module 118 that is coupled to receive digital signal 142 from ADC 116. In described embodiments, filtering module 118 may be a low pass filter having various forms including, but not limited to, a cascaded integrator-comb (CIC) decimation filter or a switched capacitor filter. Digital system 104 may also include clock module 124, which is coupled to, and provides one or more clock signals to, controller 126. In described embodiments, controller 126 is coupled to receive filtered magnetic field output signal 144 from filter module 118 and, in response, is configured to generate a sensor output signal as may be transmitted by SENT/PWM transmitter 130 of communication interface 134. For example, controller 126 may provide signal(s) to SENT/PWM transmitter 130 to generate an output signal of magnetic field sensor 100 to be transmitted to an external device coupled to magnetic field sensor 100, such as an ECU (not shown). The SENT/PWM output signal is generally indicative of an output of the magnetic field sensing elements 110 and 112. For example, the SENT/PWM output signal may indicate one or more of a position of the target, a speed of motion of the target, a direction of motion of the target, and an angle of the target.

As shown in FIG. 1, SENT/PWM signal may be a bidirectional communication signal to send and receive data to/from devices external to magnetic field sensor 100, such as an ECU. Serial receiver 136 may receive signals and provide received data to controller 126. In some embodiments, serial receiver 136 may decode Manchester encoded serial data and provide a received signal to controller 126. Controller 126 may adjust operation of magnetic field sensor 100 in response to a received signal, or may transmit a response via SENT/PWM transmitter 130. Controller 126 may also be coupled to memory 122, which may store data associated with operation of magnetic field sensor 100, for example past values of the SENT/PWM output signal, past data output from elements 110 and 112 (e.g., past values of filtered magnetic field output signal 144), data received (e.g., received from an ECU), variable settings for operation of magnetic field sensor 100, and so forth. Further, in some embodiments, controller 126 might be configured to adjust biasing or trimming of elements 110 and 112.

It will be appreciated that while communication interface 134 is described as transmitting and receiving a SENT and/or PWM formatted signal, other signal formats are possible for communicating sensor information including, but not limited to, I²C, SPI (serial peripheral interface), and A/B/I format.

Figure 2:
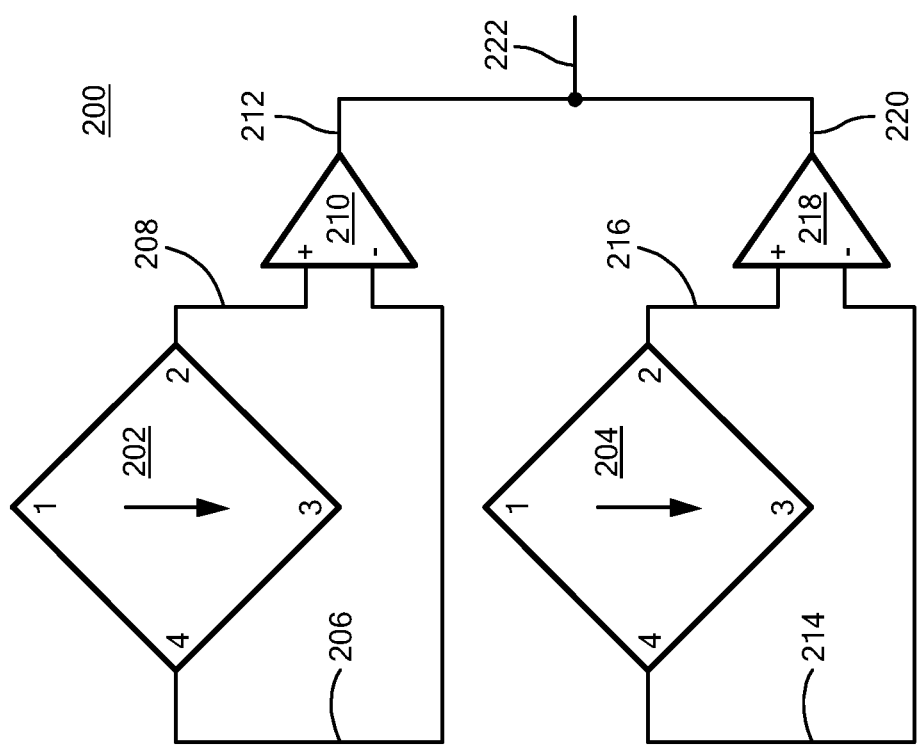
FIG. 2 shows an arrangement of Hall effect sensing elements of a magnetic field sensor in accordance with the prior art.

FIG. 2 shows a block diagram of a conventional magnetic field sensing element arrangement 200. As shown, in a conventional system, two magnetic field sensing elements (e.g., Hall effect elements) 202 and 204 might be employed to detect a magnetic field. As shown, each Hall effect sensing element 202 and 204 might have four contacts, or terminals (1, 2, 3, 4). Two contacts from Hall effect sensing element 202 (shown as signals 206 and 208) are coupled to amplifier 210, and two contacts from Hall effect sensing element 204 (shown as signals 214 and 216) are coupled to amplifier 218. As shown, one input for each of amplifiers 210 and 218 might generally be a positive input, and one input for each of amplifiers 210 and 218 might generally be a negative input. Amplifiers 210 and 218 generate output signals 212 and 220, respectively. Output signals 212 and 220 are then summed to generate magnetic field output signal 222. Amplifiers 210 and 218 amplify the outputs 206, 208, 214 and 216 of the Hall effect sensing elements 202 and 204.

Thus, as shown in FIG. 2, a conventional system includes two dedicated amplifiers (210, 218) that are coupled to Hall effect sensing elements 202 and 204, and then the difference is taken at the output of the amplifiers 210, 218 to generate magnetic field signal 222. Such a system requires two amplifiers 210 and 218 with their respective power and physical space requirements and preferably requires matching of the amplifier characteristics.

Figure 3:
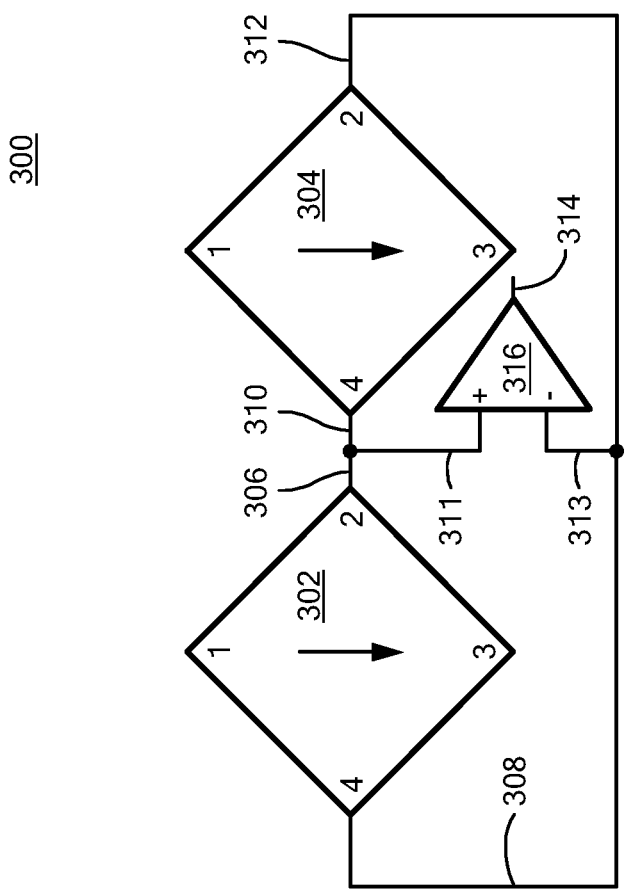
FIG. 3 shows an arrangement of Hall effect sensing elements of a magnetic field sensor in accordance with described embodiments.

FIG. 3 shows a block diagram of a magnetic field sensing element arrangement 300 in accordance with described embodiments. As will be described, some embodiments provide an arrangement for magnetic field sensing elements that determines an analog difference of magnetic fields sensed by the magnetic field sensing elements, which achieves improved stray field immunity, particularly for high frequency stray fields. Some embodiments may also provide a signal chopping scheme to reduce or eliminate DC offset.

As shown in FIG. 3, a described embodiment may include two magnetic field sensing elements (e.g., Hall effect sensing elements) 302 and 304 to detect a magnetic field. As shown, each Hall effect sensing element 302 and 304 may have four contacts (1, 2, 3, 4). One contact from Hall effect sensing element 302 (shown as signal 306) is coupled to an opposite polarity contact from Hall effect sensing element 304 (shown as signal 310) to generate combined signal 311. Another contact from Hall effect sensing element 302 (shown as signal 308, having the opposite polarity of signal 306) is coupled to an opposite polarity contact from Hall effect sensing element 304 (shown as signal 312) to generate combined signal 313. Combined signals 311 and 313 are provided to inputs of amplifier 316 to generate a difference signal 314. The Hall elements are concurrently or simultaneously driven with a current in the same direction through both elements, and with a current having the same phase. However, output signals of opposite polarity are coupled to each other. With this arrangement, the field effects common to both elements (such as stray fields) cancel, thereby resulting in an output that is stray field immune. A differential field (the field desired to be detected) has the same polarity for each of the two Hall effect elements, and thus the output signal resulting from the configuration 300 will be one-half of the drive voltage level.

Thus, as shown in FIG. 3, described embodiments include only one amplifier 316 coupled to Hall effect sensing elements 302 and 304 to generate difference signal 314 in the analog domain by connecting the magnetic field sensor output signals in a particular manner, and then processing the combined signals 311 and 313 through a single FEAMP (316) to generate difference signal 314. Advantages of such embodiments over conventional systems include a capability of rejecting high frequency stray field immunity without needing to employ complex ADC and/or DSP, lower cost, lower power consumption, and smaller physical size due to only employing one amplifier, and having the only source of signal error be due to Hall effect sensing element sensitivity mismatch, which can be compensated.

Referring also to FIG. 4, magnetic field sensing element arrangement 400 including elements 302, 304 (FIG. 3) is shown to be coupled to respective switch networks or arrays 402, 404, respectively. Switch arrays 402, 404 can form part of switching and amplification circuit 114 (FIG. 1) and, in general, can be coupled between sensing elements 302, 304 and an amplifier (e.g., amplifier 316 in FIG. 3) and controlled in order to selectively couple sensing element terminals to inputs of the amplifier. First Hall effect sensing element 302 and second Hall effect sensing element 304 may generally be referred to as "left" and "right" elements, as shown in FIG. 4, although this is meant to easily differentiate between the two different elements and does not necessarily imply a directionality of the elements.

Table 1 below illustrates control of switches within the switch arrays 402, 404. Signal hp1_sw<15:0> may generally be a digital input signal to control switch array 402 for "left" element 302. Signal hpr_sw<15:0> may generally be a digital input signal to control switch array 404 for "right" element 304. Each element 302 and 304 may have a positive and a negative analog output signal, which is selected by the respective switch arrays 402 and 404, from the respective "left" and "right" element terminals "HL1"-"HL4" and "HR1"-"HR4". Signals hp1_sw and hpr_sw may generally be provided to switch arrays 402 and 404 by digital controller 126 of FIG. 1. As shown in Table 1, "V+" may represent the positive output signal of a given element, "V−" may represent the negative output signal of a given element, and "I+" may represent the positive bias input (current or voltage) of a given element, and "I−" may represent the negative bias input (current or voltage) of a given element. In a desirable embodiment, both elements 302, 304 have effectively the same or substantially similar sensitivity to magnetic fields.

Table 1 contains rows corresponding to different operational phases. Such phases refer to chopping phases in embodiments implementing chopping. Thus, in embodiments that do not implement chopping, only a single phase may be used. Table 1 illustrates a 4 phase chopping scheme and the Hall plate connections are illustrated in FIGS. 5A-5D for respective phases 0-3.

HR3 of "right" Hall element 304 is coupled to "V−", and terminal HR1 of "right" Hall element 304 is coupled to "V+". Each Hall element is driven by an input current applied from terminal 2 (e.g., HL2 and HR2 are "I+") to terminal 4 (e.g., HL4 and HR4 are "I−"). Thus, as shown, the two Hall elements are concurrently or simultaneously driven with a current in the same direction through both elements, and with a current having the same phase. However, signals of opposite polarity are coupled to each other, resulting in differential signals that subtract, thus cancelling stray field signals and resulting in an output that is stray field immune. Thus, as shown in FIG. 5B, terminal HL3 is coupled to terminal HR1 to generate HOUTP (e.g., the positive differential output signal of the magnetic field sensor), and terminal HL1 is coupled to terminal HR3 to generate HOUTN (e.g., the negative differential output signal of the

TABLE 1

Figure 5A:
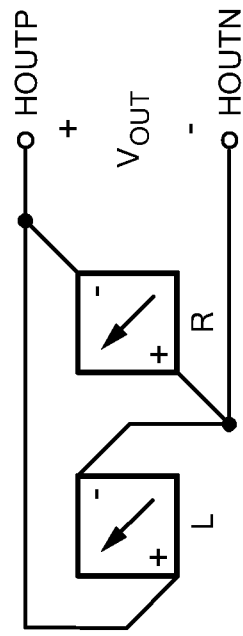
FIGS. 5A, 5B, 5C, and 5D show output connections of a magnetic field sensor employing a chopping circuit in accordance with described embodiments.
Figure 5C:
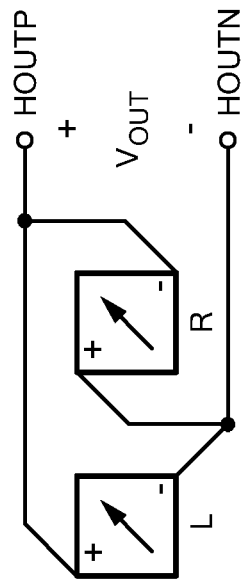
Figure 5B:
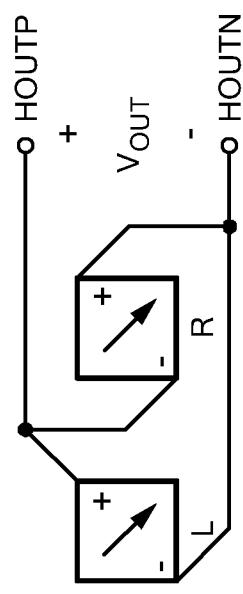
Figure 5D:
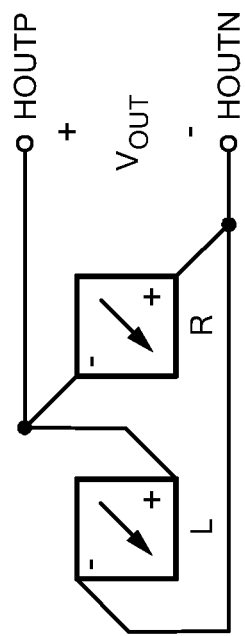

| | | Left plate switch <15:0> | | | | Right plate switch <15:0> | | | |
|---|---|---|---|---|---|---|---|---|---|
| Phase (FIG.) | Output | <15:12> HL1 | <11:8> HL2 | <7:4> HL3 | <3:0> HL4 | <15:12> HR1 | <11:8> HR2 | <7:4> HR3 | <3:0> HR4 |
| 0 FIG. 5A | L-R | 1000 I+ | 0100 V+ | 0010 I− | 0001 V− | 1000 I+ | 0001 V− | 0010 I− | 0100 V+ |
| 1 FIG. 5B | −(L-R) | 0001 V− | 1000 I+ | 0100 V+ | 0010 I− | 0100 V+ | 1000 I+ | 0001 V− | 0010 I− |
| 2 FIG. 5C | L-R | 0010 I− | 0001 V− | 1000 I+ | 0100 V+ | 0010 I− | 0100 V+ | 1000 I+ | 0001 V− |
| 3 FIG. 5D | −(L-R) | 0100 V+ | 0010 I− | 0001 V− | 1000 I+ | 0001 V− | 0010 I− | 0100 V+ | 1000 I+ |

FIGS. 5A-5D show output connections of a magnetic field sensor employing a chopping circuit in accordance with described embodiments, for example as shown in FIG. 4 and Table 1. For example, FIG. 5A shows the connection of "left" and "right" Hall elements 302 and 304 for phase 0, as shown in Table 1. As shown in Table 1, during phase 0, terminal HL2 of "left" Hall element 302 is coupled to "V+", and terminal HL4 of "left" Hall element 302 is coupled to "V−", while terminal HR2 of "right" Hall element 304 is coupled to "V−", and terminal HR4 of "right" Hall element 304 is coupled to "V+". Each Hall element is driven by an input current applied from terminal 1 (e.g., HL1 and HR1 are "I+") to terminal 3 (e.g., HL3 and HR3 are "I−"). Thus, as shown, the two Hall elements are concurrently or simultaneously driven with a current in the same direction through both elements, and with a current having the same phase. However, output signals of opposite polarity are coupled to each other, resulting in differential signals that subtract, thus cancelling the effect of stray fields and resulting in an output that is stray field immune. Thus, as shown in FIG. 5A, terminal HL2 is coupled to terminal HR4 to generate HOUTP (e.g., the positive differential output signal of the magnetic field sensor), and terminal HL4 is coupled to terminal HR2 to generate HOUTN (e.g., the negative differential output signal of the magnetic field sensor), resulting in an output voltage of the magnetic field sensor that is equal to the left sensing element signal minus the right sensing element signal (e.g., $sig_L - sig_R$). The subtraction of the differential signals occurs by reversing the polarity of one plate relative to the other.

FIG. 5B shows the connection of "left" and "right" Hall elements 302 and 304 for phase 1, as shown in Table 1. As shown in Table 1, during phase 1, terminal HL3 of "left" Hall element 302 is coupled to "V+", and terminal HL1 of "left" Hall element 302 is coupled to "V−", while terminal magnetic field sensor), resulting in an output voltage of the magnetic field sensor that is equal to the left sensing element signal less the right sensing element signal (e.g., $-(sig_L - sig_R)$). The subtraction of the differential signals occurs by reversing the polarity of one plate relative to the other.

FIG. 5C shows the connection of "left" and "right" Hall elements 302 and 304 for phase 2, as shown in Table 1. As shown in Table 1, during phase 2, terminal HL4 of "left" Hall element 302 is coupled to "V+", and terminal HL2 of "left" Hall element 302 is coupled to "V−", while terminal HR4 of "right" Hall element 304 is coupled to "V−", and terminal HR2 of "right" Hall element 304 is coupled to "V+". Each Hall element is driven by an input current applied from terminal 3 (e.g., HL3 and HR3 are "I+") to terminal 1 (e.g., HL1 and HR1 are "I−"). Thus, as shown, the two Hall elements are concurrently or simultaneously driven with a current in the same direction through both elements, and with a current having the same phase. However, signals of opposite polarity are coupled to each other, resulting in differential signals that subtract, thus cancelling stray field signals and resulting in an output that is stray field immune. Thus, as shown in FIG. 5C, terminal HL4 is coupled to terminal HR2 to generate HOUTP (e.g., the positive differential output signal of the magnetic field sensor), and terminal HL2 is coupled to terminal HR4 to generate HOUTN (e.g., the negative differential output signal of the magnetic field sensor), resulting in an output voltage of the magnetic field sensor that is equal to the left sensing element signal less the right sensing element signal (e.g., $sig_L - sig_R$). The subtraction of the differential signals occurs by reversing the polarity of one plate relative to the other.

FIG. 5D shows the connection of "left" and "right" Hall elements 302 and 304 for phase 3, as shown in Table 1. As shown in Table 1, during phase 3, terminal HL1 of "left" Hall element 302 is coupled to "V+", and terminal HL3 of "left" Hall element 302 is coupled to "V−", while terminal HR1 of "right" Hall element 304 is coupled to "V−", and terminal HR3 of "right" Hall element 304 is coupled to "V+". Each Hall element is driven by an input current applied from terminal 4 (e.g., HL4 and HR4 are "F") to terminal 2 (e.g., HL2 and HR2 are "I−"). Thus, as shown, the two Hall elements are concurrently or simultaneously driven with a current in the same direction through both elements, and with a current having the same phase. However, signals of opposite polarity are coupled to each other, resulting in differential signals that subtract, thus cancelling stray field signals and resulting in an output that is stray field immune. Thus, as shown in FIG. 5D, terminal HL1 is coupled to terminal HR3 to generate HOUTP (e.g., the positive differential output signal of the magnetic field sensor), and terminal HL3 is coupled to terminal HR1 to generate HOUTN (e.g., the negative differential output signal of the magnetic field sensor), resulting in an output voltage of the magnetic field sensor that is equal to the left sensing element signal less the right sensing element signal (e.g., −(sig$_L$− sig$_R$)). The subtraction of the differential signals occurs by reversing the polarity of one plate relative to the other.

As shown in FIGS. 5A-5D, in embodiments where DC offset is an important consideration, chopping may be employed to "rotate" through 2 or 4 of the phases shown in Table 1 to eliminate the offset signal (e.g., off$_L$-off$_R$). Note that in each chopping phase shown in Table 1, the negative voltage output of one of the Hall elements is coupled to the positive of voltage output of the other Hall element, and vise-versa, thereby maintaining the stray field immunity benefits of the Hall plate configuration during chopping.

Figure 6:
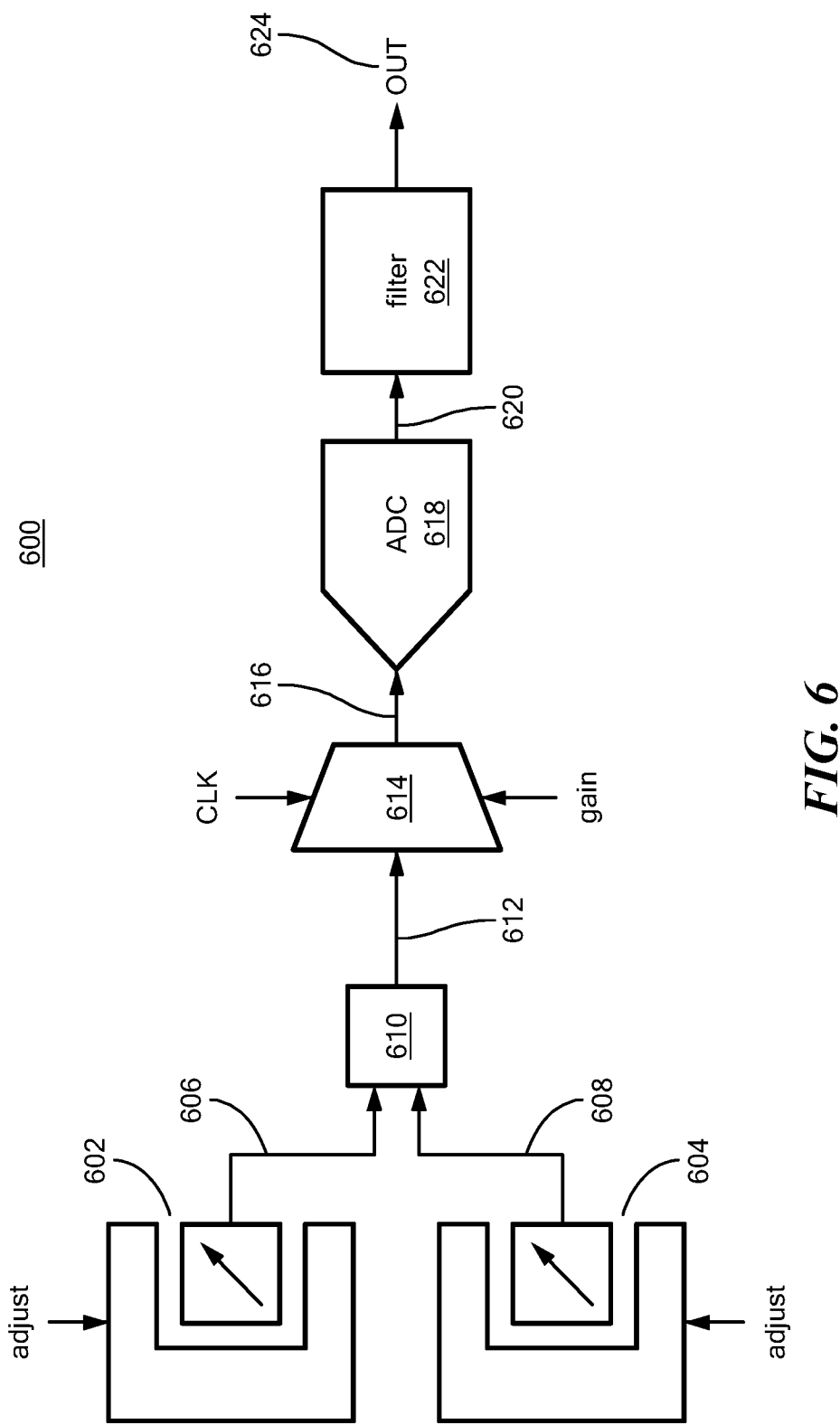
FIG. 6 shows an illustrative schematic of a magnetic field sensor circuit in accordance with described embodiments.

FIG. 6 shows a block diagram of a signal processing path of a magnetic field sensor such as shown in FIG. 1. As shown in FIG. 6, magnetic field sensor system 600 includes two or more spaced magnetic field sensing elements 602 and 604, each spaced from the other by a predetermined distance, for sensing a magnetic field affected by a target (not shown in FIG. 6) and generating respective magnetic field signals 606 and 608. A modulator, as may take the form of a switching module 610, is coupled to receive the first and second magnetic field signals 606 and 608 and is configured to generate a combined signal 612. Amplifier 614 is coupled to receive the combined signal 612 and generate amplified signal 616. Analog-to-digital converter (ADC) 618 may be provided to convert the amplified signal 616 into a digital signal 620.

Filter 622 is coupled to receive the digital signal 620 and generate an output signal 624. In some embodiments, filter 622 is a low pass filter having a cutoff frequency less than or equal to a rate of the clock signal (CLK) and a zero at the frequency of the clock signal (CLK). Various forms and types of low pass filters are possible including, but not limited to a cascaded integrator-comb (CIC) decimation filter or a switched capacitor filter. The magnetic field sensor 600 may be provided in the form of an integrated circuit in some embodiments.

Figure 7:
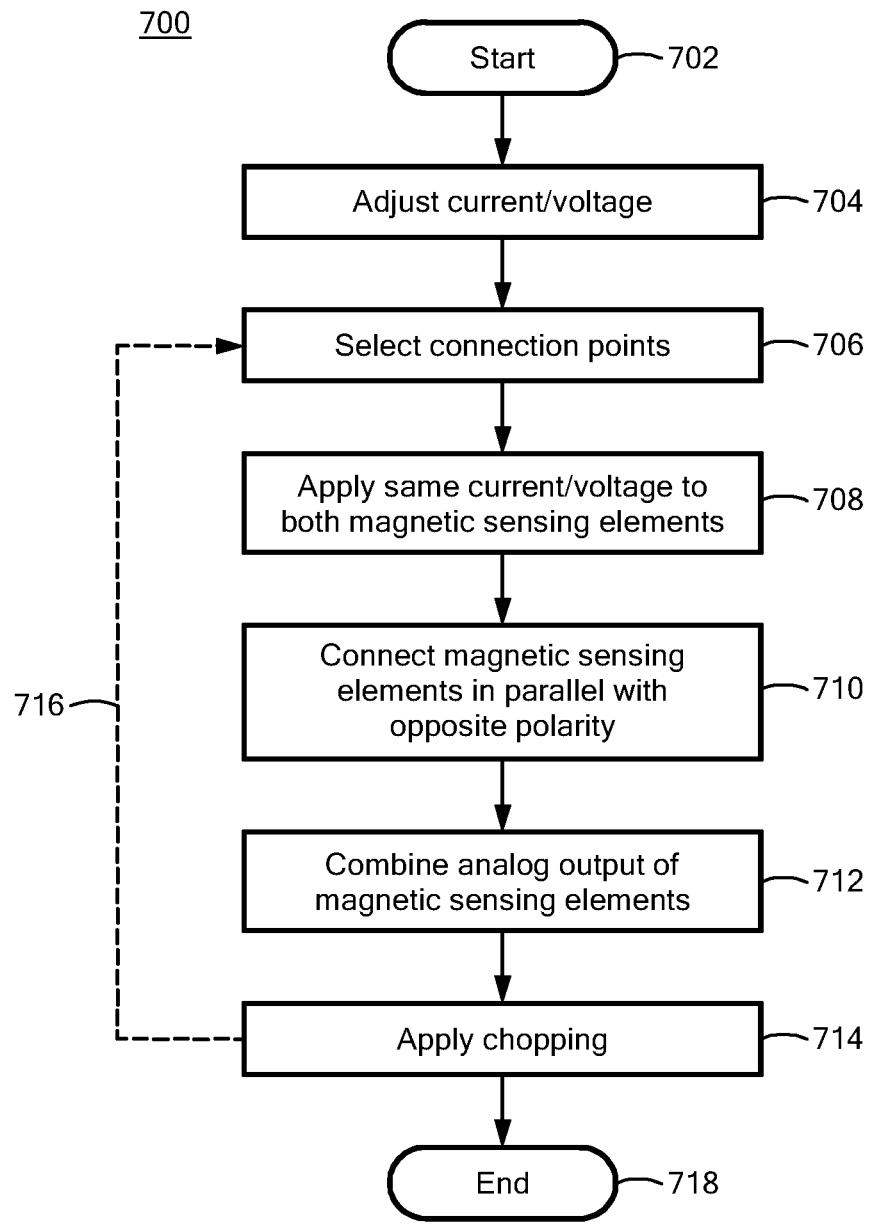
FIG. 7 shows a flow diagram of a technique of operating a magnetic field sensor in accordance with described embodiments.

FIG. 7 shows an illustrative method 700 for sensing a magnetic field, for example using magnetic field sensor 100. At block 702, process 700 begins. At block 704, a bias current and/or bias voltage applied to each of the magnetic field sensing elements (e.g., 110 and 112 of FIG. 1) may optionally be adjusted, for example to adjust a DC offset of the magnetic field sensing elements. At block 706, when chopping is being employed, connection points may be selected for the magnetic field sensing elements, for example as described in regard to Table 1 and FIGS. 4 and 5A-5D. At block 708, the selected currents and/or voltages are applied to both magnetic field sensing elements. At block 710, the switch arrays connect the magnetic field sensing elements in parallel with opposite polarity to the amplifier as described in connection with FIG. 3. At block 712, the analog magnetic field sensing element output signals are combined and applied to the amplifier, which amplifies the combined analog signals and generates an output signal in which high frequency stray fields are rejected. At block 714, chopping is optionally applied, for example by returning process 700 to block 706 to select new connection points for the magnetic field sensing elements, for example as described in regard to Table 1 and FIGS. 4 and 5A-5D. At block 718, process 700 is complete. Alternatively, process 700 may continue to run, for example as long as system 100 is powered.

Thus, as described herein, embodiments provide a magnetic field sensor having a first magnetic field sensing element and a second magnetic field sensing element disposed at a predetermined distance from the first magnetic field sensing element. The first and second magnetic field sensing elements generate first and second magnetic field signals, respectively, that are indicative of a magnetic field associated with a target. A switching module couples the first magnetic field sensing element and the second magnetic field sensing element in parallel to an amplifier by coupling a first terminal of the first magnetic field sensing element having a first polarity to a first terminal of the second magnetic field sensing element having a polarity opposite the first polarity to generate a first combined signal, and coupling a second terminal of the first magnetic field sensing element having a polarity opposite the first polarity to a second terminal of the second magnetic field sensing element having the first polarity to generate a second combined signal. The switching module simultaneously couples the first combined signal and the second combined signal to the amplifier. The amplifier generates a magnetic field output signal indicative of the magnetic field associated with the target that has stray magnetic field effects cancelled.

Reference herein to "one embodiment" or "an embodiment" means that a particular feature, structure, or characteristic described in connection with the embodiment can be included in at least one embodiment of the claimed subject matter. The appearances of the phrase "in one embodiment" in various places in the specification are not necessarily all referring to the same embodiment, nor are separate or alternative embodiments necessarily mutually exclusive of other embodiments. The same applies to the term "implementation."

Some embodiments might be implemented in the form of methods and apparatuses for practicing those methods. Further, as would be apparent to one skilled in the art, various functions of circuit elements may be implemented as a software program. Described embodiments might be implemented in the form of program code embodied in tangible media, such as magnetic media, optical media, solid state memory, hard drives, or any other machine-readable storage medium, wherein, when the program code is loaded into and executed by a machine, such as a computer, the machine becomes an apparatus for practicing the method implemented by the program code. When implemented on one or more processors, including for example, one or more digital signal processors (DSPs), central processing units (CPUs), graphics processing units (GPUs), microcontrollers, application specific integrated circuits (ASICs), field programmable gate arrays (FPGAs), or general purpose computers, the program code combines with the processor(s) to provide a unique device that operates analogously to specific logic circuits.

It should be understood that the steps of the illustrative methods set forth herein are not necessarily required to be performed in the order described. Likewise, additional steps may be included in such methods, and certain steps may be omitted or combined, in methods consistent with various embodiments.

It will be further understood that various changes in the details, materials, and arrangements of the parts which have been described and illustrated in order to explain the nature of the described embodiments might be made by those skilled in the art without departing from the scope of the following claims.

What is claimed is:

1. A magnetic field sensor comprising:
   a first magnetic field sensing element configured to generate a first magnetic field signal indicative of a magnetic field associated with a target;
   a second magnetic field sensing element, disposed at a predetermined distance from the first magnetic field sensing element, configured to generate a second magnetic field signal indicative of the magnetic field associated with the target, wherein each of the first and second magnetic field sensing elements has four terminals; and
   a switching module configured to couple the first magnetic field sensing element and the second magnetic field sensing element in parallel to an amplifier, the switching module comprising one or more of: a switch matrix comprising a plurality of switches, and one or more multiplexers and configured to:
      couple a first terminal of the first magnetic field sensing element having a first polarity to a first terminal of the second magnetic field sensing element having a polarity opposite the first polarity to generate a first combined signal;
      couple a second terminal of the first magnetic field sensing element having a polarity opposite the first polarity to a second terminal of the second magnetic field sensing element having the first polarity to generate a second combined signal; and
      simultaneously couple the first combined signal and the second combined signal to the amplifier, the amplifier configured to generate a magnetic field output signal indicative of a difference between the first combined signal and the second combined signal, wherein the difference is indicative of the magnetic field associated with the target that has stray magnetic field effects cancelled;
   wherein the switching module comprises:
      a set of four switches for each terminal of the first and second magnetic field sensing elements, each set of four switches configured to selectively couple each terminal to one of a drive input signal having a positive polarity, a drive input signal having a negative polarity, an output signal having a positive polarity, and an output signal having a negative polarity,
      wherein, for the first magnetic field sensing element, the first terminal is coupled to the positive polarity drive input signal, the second terminal opposite the first terminal is coupled to the negative polarity drive input signal, a third terminal is coupled to the positive polarity output signal, and a fourth terminal is coupled to the negative polarity output signal, and
      wherein, for the second magnetic field sensing element, the first terminal is coupled to the positive polarity drive input signal, the second terminal opposite the first terminal is coupled to the negative polarity drive input signal, a third terminal is coupled to the positive polarity output signal, and a fourth terminal is coupled to the negative polarity output signal.

2. The magnetic field sensor of claim 1, wherein the switching module is further configured to provide chopping to reduce a DC (Direct Current) offset of the first magnetic field signal and the second magnetic field signal.

3. The magnetic field sensor of claim 2, wherein, to provide chopping, the switching module is configured to selectively change which of the four terminals of the first magnetic field sensing element is coupled to the positive polarity drive input signal, the negative polarity drive input signal, the positive polarity output signal, and the negative polarity output signal, and to selectively change which of the four terminals of the second magnetic field sensing element is coupled to the positive polarity drive input signal, the negative polarity drive input signal, the positive polarity output signal, and the negative polarity output signal, wherein the selective changing reduces a DC (Direct Current) offset of the first and second combined signals.

4. The magnetic field sensor of claim 3, further comprising a clock module configured to generate a clock signal, and wherein the switching module is configured to provide chopping based upon the clock signal.

5. The magnetic field sensor of claim 3, wherein the switching module is configured to selectively provide chopping for one of:
   zero phases by not selectively changing which terminals of the first and second magnetic field sensing elements are coupled to the positive polarity drive input signal, the negative polarity drive input signal, the positive polarity output signal, and the negative polarity output signal;
   2 phases (2× chopping) by selectively changing between a first set of terminal connections and a second set of terminal connections to the positive polarity drive input signal, the negative polarity drive input signal, the positive polarity output signal, and the negative polarity output signal; and
   4 phases (4× chopping) by selectively changing between a first set of terminal connections, a second set of terminal connections, a third set of terminal connections, and a fourth set of terminal connections to the positive polarity drive input signal, the negative polarity drive input signal, the positive polarity output signal, and the negative polarity output signal.

6. The magnetic field sensor of claim 1, wherein the switching module is further configured to provide a determined drive signal to a selected terminal of each of the first and the second magnetic field sensing elements.

7. The magnetic field sensor of claim 6, wherein the drive signal is one of a determined voltage and a determined current.

8. The magnetic field sensor of claim 1, further comprising a controller coupled to the switching module and configured to generate a sensor output signal indicative of the magnetic field output signal.

9. The magnetic field sensor of claim 1, wherein the first and second magnetic field sensing elements comprise one or more Hall effect elements.

10. The magnetic field sensor of claim 1, wherein the magnetic field output signal is proportional to a difference between the first magnetic field signal and the second magnetic field signal.

11. A method for sensing a magnetic field, the method comprising:
generating a first magnetic field signal with a first magnetic field sensing element, the first magnetic field signal indicative of a magnetic field associated with a target;
generating a second magnetic field signal with a second magnetic field sensing element spaced from the first magnetic field sensing element, the second magnetic field signal indicative of the magnetic field associated with the target, wherein each of the first and second magnetic field sensing elements has four terminals;
generating a magnetic field output signal indicative of the magnetic field by coupling the first magnetic field sensing element and the second magnetic field sensing element in parallel to an amplifier, the coupling comprising:
coupling a first terminal of the first magnetic field sensing element having a first polarity to a first terminal of the second magnetic field sensing element having a polarity opposite the first polarity and generating a first combined signal;
coupling a second terminal of the first magnetic field sensing element having a polarity opposite the first polarity to a second terminal of the second magnetic field sensing element having the first polarity and generating a second combined signal;
simultaneously coupling the first combined signal and the second combined signal to the amplifier; and
generating the magnetic field output signal, wherein the magnetic field output signal is indicative of a difference between the first combined signal and the second combined signal that has stray magnetic field effects cancelled
selectively coupling, by a set of switches coupled to each terminal of the first magnetic field sensing element, the first terminal of the first magnetic field sensing element to a positive polarity drive input signal, the second terminal of the first magnetic field sensing element, opposite the first terminal, to a negative polarity drive input signal, a third terminal of the first magnetic field sensing element to a positive polarity output signal, and a fourth terminal of the first magnetic field sensing element, opposite the third terminal, to a negative polarity output signal; and
selectively coupling, by a set of switches coupled to each terminal of the second magnetic field sensing element, the first terminal of the second magnetic field sensing element to a positive polarity drive input signal, the second terminal of the second magnetic field sensing element, opposite the first terminal, to a negative polarity output signal, a third terminal of the second magnetic field sensing element to a positive polarity output signal, and a fourth terminal of the second magnetic field sensing element, opposite the third terminal, to a negative polarity output signal.

12. The method of claim 11, further comprising:
providing chopping to reduce a DC (Direct Current) offset of the first magnetic field signal and the second magnetic field signal.

13. The method of claim 12, further comprising:
selectively changing which of the four terminals of the first magnetic field sensing element is coupled to the positive polarity drive input signal, the negative polarity drive input signal, the positive polarity output signal, and the negative polarity output signal, and to selectively change which of the four terminals of the second magnetic field sensing element is coupled to the positive polarity drive input signal, the negative polarity drive input signal, the positive polarity output signal, and the negative polarity output signal, wherein the selective changing reduces a DC (Direct Current) offset of the first and second combined signals.

14. The method of claim 13, wherein the chopping comprises one of:
performing chopping for zero phases by not selectively changing which terminals of the first and second magnetic field sensing elements are coupled to the positive polarity drive input signal, the negative polarity drive input signal, the positive polarity output signal, and the negative polarity output signal;
performing chopping for 2 phases (2× chopping) by selectively changing between a first set of terminal connections and a second set of terminal connections to the positive polarity drive input signal, the negative polarity drive input signal, the positive polarity output signal, and the negative polarity output signal; and
performing chopping for 4 phases (4× chopping) by selectively changing between a first set of terminal connections, a second set of terminal connections, a third set of terminal connections, and a fourth set of terminal connections to the positive polarity drive input signal, the negative polarity drive input signal, the positive polarity output signal, and the negative polarity output signal.

15. The method of claim 11, further comprising:
providing a determined drive signal to a selected terminal of each of the first and the second magnetic field sensing elements.

16. The method of claim 15, wherein the drive signal is one of a determined voltage and a determined current.

17. The method of claim 11, further comprising:
generating a sensor output signal indicative of the magnetic field output signal.

18. The method of claim 11, wherein the first and second magnetic field sensing elements each comprise one or more Hall effect elements.

19. A magnetic field sensor comprising:
first magnetic field sensing means configured to generate a first magnetic field signal indicative of a magnetic field associated with a target;
second magnetic field sensing means, disposed at a predetermined distance from the first magnetic field sensing means, configured to generate a second magnetic field signal indicative of the magnetic field associated with the target, wherein each of the first and second magnetic field sensing elements has four terminals; and
switching means configured to couple the first magnetic field sensing means and the second magnetic field sensing means in parallel to amplification means, the switching means configured to:
couple a first terminal of the first magnetic field sensing means having a first polarity to a first terminal of the second magnetic field sensing means having a polarity opposite the first polarity to generate a first combined signal;
couple a second terminal of the first magnetic field sensing means having a polarity opposite the first polarity to a second terminal of the second magnetic field sensing means having the first polarity to generate a second combined signal; and simultaneously couple the first combined signal and the second combined signal to the amplification means, the amplification means configured to generate a magnetic field output signal indicative of a difference between the first combined signal and the second combined signal, wherein the difference is indicative of the magnetic field associated with the target that has stray magnetic field effects cancelled; wherein the switching module comprises:

a set of four switches for each terminal of the first and second magnetic field sensing elements, each set of four switches configured to selectively couple each terminal to one of a drive input signal having a positive polarity, a drive input signal having a negative polarity, an output signal having a positive polarity, and an output signal having a negative polarity, wherein, for the first magnetic field sensing element, the first terminal is coupled to the positive polarity drive input signal, the second terminal opposite the first terminal is coupled to the negative polarity drive input signal, a third terminal is coupled to the positive polarity output signal, and a fourth terminal is coupled to the negative polarity output signal, and wherein, for the second magnetic field sensing element, the first terminal is coupled to the positive polarity drive input signal, the second terminal opposite the first terminal is coupled to the negative polarity drive input signal, a third terminal is coupled to the positive polarity output signal, and a fourth terminal is coupled to the negative polarity output signal.

* * * * *

UNITED STATES PATENT AND TRADEMARK OFFICE
CERTIFICATE OF CORRECTION

| | |
|---|---|
| PATENT NO. | : 11,163,019 B1 |
| APPLICATION NO. | : 16/985577 |
| DATED | : November 2, 2021 |
| INVENTOR(S) | : Virag Chaware et al. |

It is certified that error appears in the above-identified patent and that said Letters Patent is hereby corrected as shown below:

In the Specification

Column 13, Line 29 delete "positive of voltage" and replace with --positive voltage--.

In the Claims

Column 17, Line 38 Claim 11 delete "cancelled" and replace with --cancelled;--.

Column 17, Line 56 Claim 11 delete "output signal," and replace with --drive input signal--.

Signed and Sealed this
Twentieth Day of December, 2022

Katherine Kelly Vidal
*Director of the United States Patent and Trademark Office*